US006049244A

United States Patent [19]

Milanesi

[11] Patent Number: 6,049,244

[45] Date of Patent: Apr. 11, 2000

[54] CIRCUIT GENERATOR OF A CONSTANT ELECTRIC SIGNAL WHICH IS INDEPENDENT FROM TEMPERATURE AND MANUFACTURING PROCESS VARIABLES

[75] Inventor: Andrea Milanesi, Casalnoceto, Italy

[73] Assignee: SGS-Thomson Microelectronics S.r.l., Agrate Brianza, Israel

[21] Appl. No.: 09/063,419

[22] Filed: Apr. 20, 1998

Related U.S. Application Data

[63] Continuation-in-part of application No. 08/993,648, Dec. 18, 1997, abandoned.

[51] Int. Cl.[7] .................... H01L 31/00

[52] U.S. Cl. .................... 327/512; 327/513

[58] Field of Search .................... 327/512, 513, 327/538, 540; 323/312, 313, 315, 907

[56] References Cited

U.S. PATENT DOCUMENTS

| | | | |
|---|---|---|---|
| 4,119,869 | 10/1978 | Hashimoto | 307/296 |
| 4,199,693 | 4/1980 | Bennett | 307/246 |
| 4,642,522 | 2/1987 | Suzuki et al. | 323/315 |
| 4,940,910 | 7/1990 | Jiang | 327/538 |
| 5,434,533 | 7/1995 | Furutani | 327/513 |
| 5,859,560 | 1/1999 | Matthews | 327/513 |
| 5,880,625 | 3/1999 | Park et al. | 327/538 |

FOREIGN PATENT DOCUMENTS

| | | | |
|---|---|---|---|
| 0 565 806 A1 | 10/1993 | European Pat. Off. . | |
| 60-113521 | 6/1985 | Japan | H03K 5/13 |
| 2 071 955 | 9/1981 | United Kingdom | G05F 1/56 |

OTHER PUBLICATIONS

"Delayed Power–On Circuit with Soft Start", *IBM Technical Disclosure Bulletin* 35(7):197, Dec. 1992.

*Primary Examiner*—Son T. Dinh

*Attorney, Agent, or Firm*—Theodore E. Galanthay; Robert Iannucci; Seed IP Law Group PLLC

[57] ABSTRACT

A circuit for the generation of an electrical signal of constant duration comprises a capacitor, a constant current generator for charging the capacitor, and a voltage comparator to compare the voltage present at the terminals of the capacitor with a reference voltage. The voltage comparator supplies at an output a digital signal dependent upon the voltage across the capacitor. The constant current generator comprises a transistor biased with a voltage between gate and source obtained as the difference between the sum of two gate-source voltages of two transistors and a gate-source voltage of another transistor.

17 Claims, 3 Drawing Sheets

CIRCUIT GENERATOR OF A CONSTANT ELECTRIC SIGNAL WHICH IS INDEPENDENT FROM TEMPERATURE AND MANUFACTURING PROCESS VARIABLES

CROSS-REFERENCE TO RELATED APPLICATION

This application is a continuation-in-part of prior application Ser. No. 08/993,648 filed on Dec. 18, 1997, now abandoned.

TECHNICAL FIELD

The present invention relates to a circuit for the generation of an electrical signal of constant duration.

BACKGROUND OF THE INVENTION

A known solution for generation of a constant current provides for the use of an appropriately biased MOS transistor.

Indeed, by applying a biasing voltage between its gate and source terminals, the MOS transistor is caused to conduct a constant current between the source and drain terminals.

As known, there exists a biasing voltage $V_{gs}=V_{gsx}$ of the gate of an MOS transistor for which the drain current is constant with temperature variation:

$$I_D=\mu\cdot C_{OX}\cdot(V_{gs}-V_{th})^2 \tag{1.1}$$

Where $\mu$ is the mobility of electrons, $C_{OX}$ is the capacitance of the silicon oxide, $V_{gs}$ is the gate biasing voltage and $V_{th}$ is the threshold voltage of the MOS transistor.

This relationship can be readily deduced by observing the drain current $I_D$ as a function of the $V_{gs}$ with different temperatures as illustrated in FIG. 1 which shows the current-voltage characteristics of an MOS transistor with three different temperatures T1, T2 and T3.

As may be seen in FIG. 1, there is a point on the chart corresponding to a voltage $V_{gsx}$ at which the three curves intersect. This relationship leads to the assumption that by using this current to charge a capacitor there could be provided an electrical signal of constant duration with temperature change of the device.

In reality the problem is not so simple since $C_{OX}$, $V_{th}$ and $\mu$ vary with the process in addition to varying with the temperature.

The mobility of electrons $\mu$ varies very little with the process because it is one of the best-controlled parameters and, indeed, it depends mainly on the doping element and is known with an accuracy of greater than 95%, the mobility can thus be considered dependent on temperature alone in a first approximation.

The problem goes back to compensating for the error introduced by the variation in the gate oxide thickness and the threshold voltage.

The prior art eliminates dependence on $C_{OX}$ by using as capacitance a capacitor whose dielectric is the same gate oxide used in the transistors. In this manner the relationship between MOS current and capacitance becomes:

$$\frac{I_D}{C}=\frac{I_D}{K_1\cdot C_{OX}}=\frac{\mu\cdot C_{OX}\cdot(V_{gsx}-V_{th})^2}{K_1\cdot C_{OX}}=\frac{\mu\cdot(V_{gsx}-V_{th})^2}{K_1} \tag{1.2}$$

where $K_1$ is a constant area factor.

A known circuit diagram which permits providing an electrical signal by this method is shown in FIG. 2.

In FIG. 2 a capacitor C is connected between a ground reference voltage GND and a constant current generator consisting essentially of an MOS transistor M1 biased with a voltage $V_{gsx}$ between the gate and source terminals. The voltage present on the capacitor C is applied to a first input terminal of a voltage comparator COMP while a second input thereof is connected to a reference voltage $V_{ref}$. The comparator COMP then compares the voltage at the terminals of the capacitor with the reference $V_{ref}$ and supplies at output a logical signal which is the result of the comparison.

One disadvantage of this circuit is that the $I_D/C_{OX}$ ratio is strongly dependent upon the threshold voltage of the transistor M1 since a variation of the threshold causes the transistor being no longer correctly biased. Consequently the $I_D/C_{OX}$ ratio also varies with temperature.

SUMMARY OF THE INVENTION

One objective of the present invention is to make available a circuit for the generation of an electrical signal of constant duration and independent of temperature and process variables to overcome the limitations indicated above with reference to the prior art.

An embodiment of the present invention is directed to a circuit for the generation of an electrical signal of constant duration. The circuit includes a capacitor, a constant current generator for charging the capacitor, and a voltage comparator to compare the voltage present at the terminals of the capacitor with a reference voltage and supply at an output a digital signal dependent upon the voltage at the terminals of the capacitor. The current generator comprises a MOS transistor biased with a voltage $V_{gsx}$ between gate and source obtained as the difference between the sum of two gate-source voltages of two MOS transistors and a gate-source voltage of another MOS transistor.

The characteristics and advantages of the method in accordance with the present invention are set forth in the description of an embodiment thereof given below by way of non-limiting example with reference to the annexed drawings.

DETAILED DESCRIPTION

Figure 1:
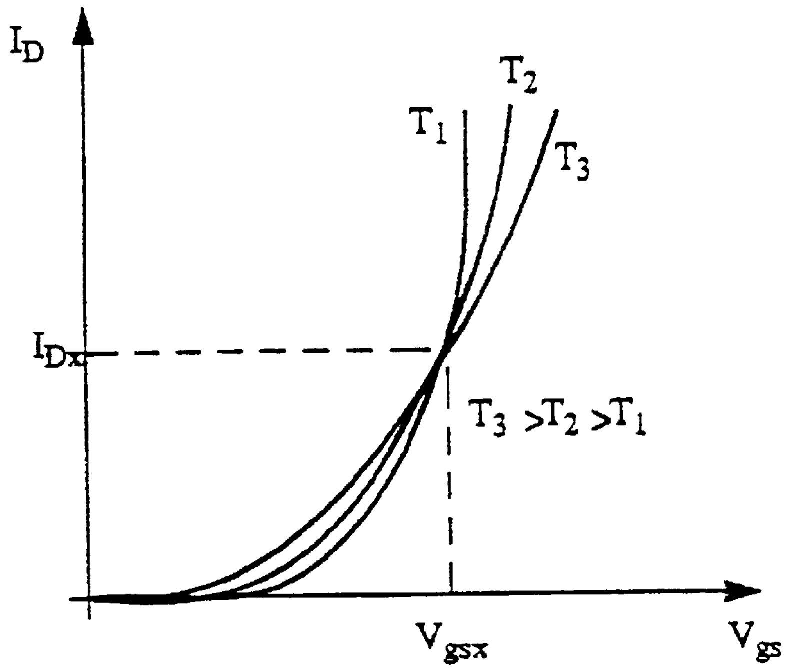
Fig. 1 (Prior Art)
FIG. 1 is a chart of the current-voltage characteristics of a MOS transistor with three different temperatures.
Figure 2:
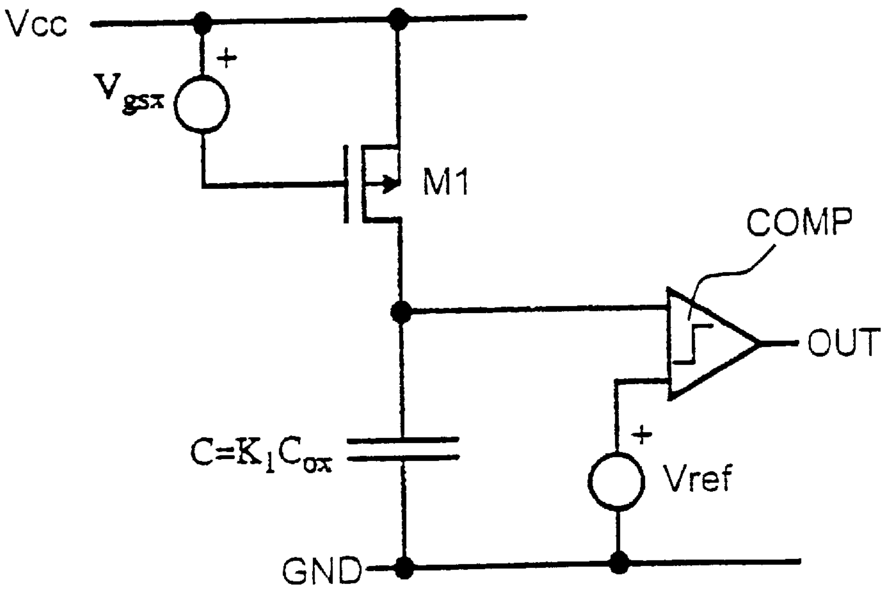
Fig. 2 (Prior Art)
FIG. 2 is a diagram of a constant duration electrical signal generation circuit of a known type.

The present invention relates to a circuit comprising a capacitor, a current generator to charge the capacitor with a constant current and a voltage comparator to compare the voltage present at the terminals of the capacitor with a reference voltage and supply at output a logical signal depending on the voltage at the terminals of the capacitor.

Upon power up of the circuit the capacitor is discharged and the output of the comparator holds a first logical level, e.g. of zero volt. Subsequently the current generator initiates charging of the capacitor and the voltage at its terminals increases until it reaches a threshold value of the comparator causing commutation of the output to a second logical level.

The capacitance of the capacitor and the value of the charge current determine the duration of the signal generated and consequently their accuracy affects the accuracy of the circuit.

Assuming that the specific capacitance of the gate oxide ($C_{OX}$) be constant with temperature variation, from the relationship (1.1) on the drain current of the MOS transistor it can be deducted that there is a gate voltage $V_{gs}=V_{gsx}$ such that:

$$\frac{I_D}{C_{OX}} = \mu \cdot (V_{gsx} - V_{th})^2 = Cost \tag{1.3}$$

where mobility $\mu$ varies with the temperature proportionately to a factor $$\left(\frac{T}{T_0}\right)^{-\frac{3}{2}},$$

while the threshold voltage $V_{th}$ varies with the temperature in such a manner as to compensate the mobility variations.

The threshold voltage $V_{th}$ is a process variable which depends on the quantity of doping agent, the oxide thickness and the quality of the oxide-semiconductor interface, hence the relationship (1.3) can no longer be true with variation of the process parameters.

To keep this relationship valid it is necessary to bias the MOS with a $V_{gsx}$ dependent upon the process variables.

Let us consider $$V_{gsx}=\Delta V_0+V_{th0}$$

as the biasing voltage, where $V_{th0}$ is the threshold voltage of the process at ambient temperature 25° C. and $\Delta V_0$ is a constant voltage $$\text{and } V_{th} = V_{th0} + \frac{\Delta V_{th}}{\Delta T} \cdot (T - 25)$$

where $\Delta V_{th}/\Delta T$ is the variation of the threshold with temperature.

Substituting both the expressions in (1.3) we find:

$$\frac{I_D}{C_{OX}} = \mu \cdot \left[\Delta V_0 + V_{th0} - V_{th0} - \frac{\Delta V_{th}}{\Delta T} \cdot (T - 25)\right]^2 = Cost$$

from which is extracted:

$$\frac{I_D}{C_{OX}} = \mu \cdot \left[\Delta V_0 - \frac{\Delta V_{th}}{\Delta T} \cdot (T - 25)\right]^2 = Cost \tag{1.4}$$

In this last relationship, dependence on the threshold voltage has been eliminated. There appear only two values $\Delta V_0$ and ($\Delta V_{th}/\Delta T$) which are independent of the process variables.

An embodiment of the present invention is directed to an electrical circuit which provides this last compensation by biasing the gate of the MOS transistor with a voltage $V_{gsx}=\Delta V_0+V_{th0}$ which makes the $I_D/C_{OX}$ ratio independent of the threshold voltage and temperature variations.

Figure 3:
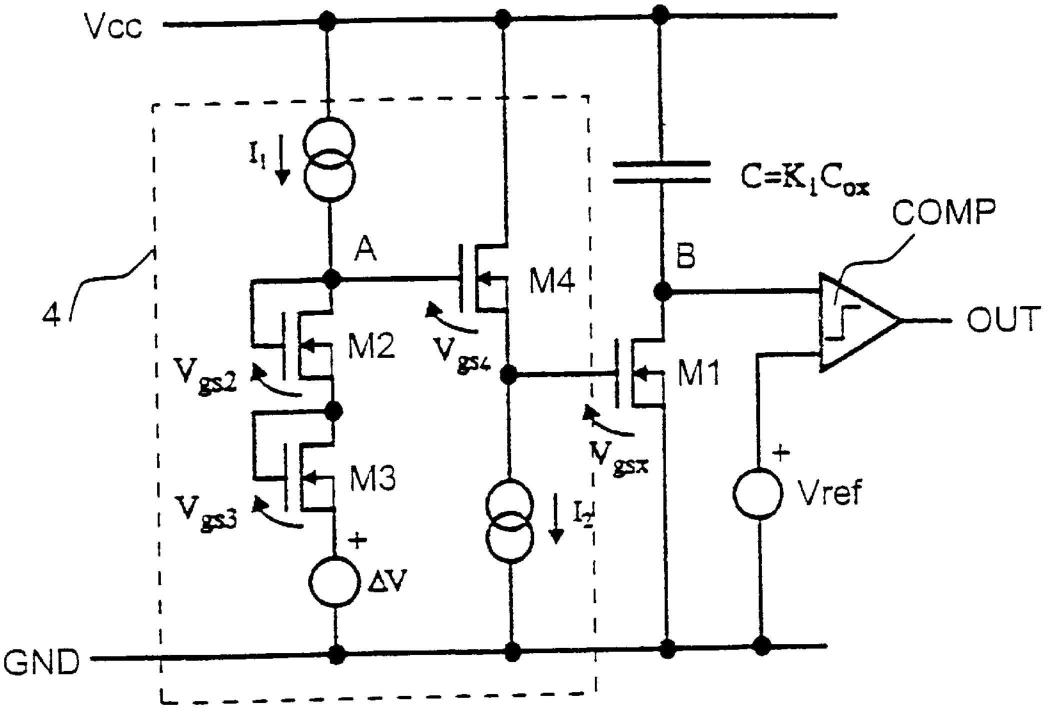
FIG. 3 is a circuit diagram of a first circuit for the generation of a constant duration electrical signal independent of temperature and process variables and provided in accordance with the present invention.

A circuit in which this compensation is implemented is shown in detail in FIG. 3.

A capacitor C is connected between a first terminal $V_{cc}$ of a supply voltage generator and a constant current generator that includes a first MOS transistor M1 and a reference biasing network 4.

The transistor M1 has a gate terminal G connected to the biasing network 4, a drain terminal D connected, in a common node B, to the capacitor C, and a source terminal S connected to a terminal (GND) of the supply voltage generator, the second terminal being a ground reference.

A comparator COMP has a first input coupled to the node B and a second input connected to a reference voltage $V_{ref}$. The voltage on the node B, which depends on the charge status of the capacitor C, is compared by the comparator with the reference voltage $V_{ref}$ and a logical output signal OUT changes state when the voltage on the capacitor exceeds the reference voltage. In this manner the output signal OUT remains at a first logic level for a precise and well defined period of time and then switches to a second logic level.

The biasing network 4 is made up of two distinct legs. A first leg comprises a second transistor M2 and a third transistor M3 connected in diode configuration, i.e., each having its gate and source terminals joined to its drain terminal, and connected together in series between a current generator $I_1$ and a reference voltage $\Delta V$.

A second leg comprises a fourth transistor M4 having a main source-drain conduction path connected in series with a current generator 12. Both legs are connected between the terminals $V_{cc}$ and GND of the power supply generator.

The fourth transistor M4 has a gate terminal connected to the common node A between the current generator $I_1$ and the drain terminal of the second transistor M2, a drain terminal connected to the power supply terminal $V_{cc}$ and a source terminal connected to the current generator $I_2$ and to the gate terminal of the first transistor M1.

The reference voltage $\Delta V$ is a voltage generator connected between the source terminal of the third transistor M3 and the terminal GND of the power supply generator.

The idea is to obtain the threshold voltage $V_{th0}$ of the MOS transistor M1 by subtracting the biasing voltage $V_{gs}$ of the transistor M4 from the sum of the biasing voltages $V_{gs}$ of the transistors M2 and M3. The transistor M4 should have an overdrive equal to the sum of the overdrives of the transistors M2 and M3. This result can be obtained as explained below by appropriately sizing the currents and transistors.

With reference to FIG. 3 we have:

$$V_{gsx}=\Delta V+V_{gs2}+V_{gs3}-V_{gs4}. \tag{1.5}$$

If we consider that:

$$V_{gs} = V_{th} + \text{overdrive} = V_{th} + \sqrt{\frac{L \cdot I_D}{2 \cdot \mu \cdot C_{OX} \cdot W}}$$

where L and W are the physical dimensions of the transistor and substituting this expression in the previous equation (1.5) we have:

$$V_{gsx} = \Delta V + V_{th} + \sqrt{\frac{L_2 \cdot I_1}{2 \cdot \mu \cdot C_{OX} \cdot W_2}} + \sqrt{\frac{L_3 \cdot I_1}{2 \cdot \mu \cdot C_{OX} \cdot W_3}} - \sqrt{\frac{L_4 \cdot I_2}{2 \cdot \mu \cdot C_{OX} \cdot W_4}}. \quad (1.6)$$

In order that the overdrives compensate each other there must be:

$$\sqrt{\frac{L_2 \cdot I_1}{2 \cdot \mu \cdot C_{OX} \cdot W_2}} + \sqrt{\frac{L_3 \cdot I_1}{2 \cdot \mu \cdot C_{OX} \cdot W_3}} = \sqrt{\frac{L_4 \cdot I_2}{2 \cdot \mu \cdot C_{OX} \cdot W_4}} \quad (1.7)$$

Equation (1.7) is considerably simplified if $$\frac{L_2}{W_2} = \frac{L_3}{W_3}$$

and in this case equation (1.7) is reduced to:

$$4 \cdot I_1 \cdot \frac{L_2}{W_2} = I_2 \cdot \frac{L_4}{W_4} \quad (1.8)$$

This allows finding a biasing voltage $V_{gsx}=\Delta V+V_{th}$ in which the threshold voltage $V_{th}$ varies with temperature. It is therefore necessary to arrange that ΔV compensate for this variation:

$$V_{gsx} = \Delta V + V_{th} = \Delta V + V_{th0} + \frac{\Delta V_{th}}{\Delta T} \cdot (T - 25) = \Delta V_0 + V_{th0}.$$

For this last equality be true, ΔV must be:

$$\Delta V = \Delta V_0 - \frac{\Delta V_{th}}{\Delta T} \cdot (T - 25). \quad (1.9)$$

Figure 4:
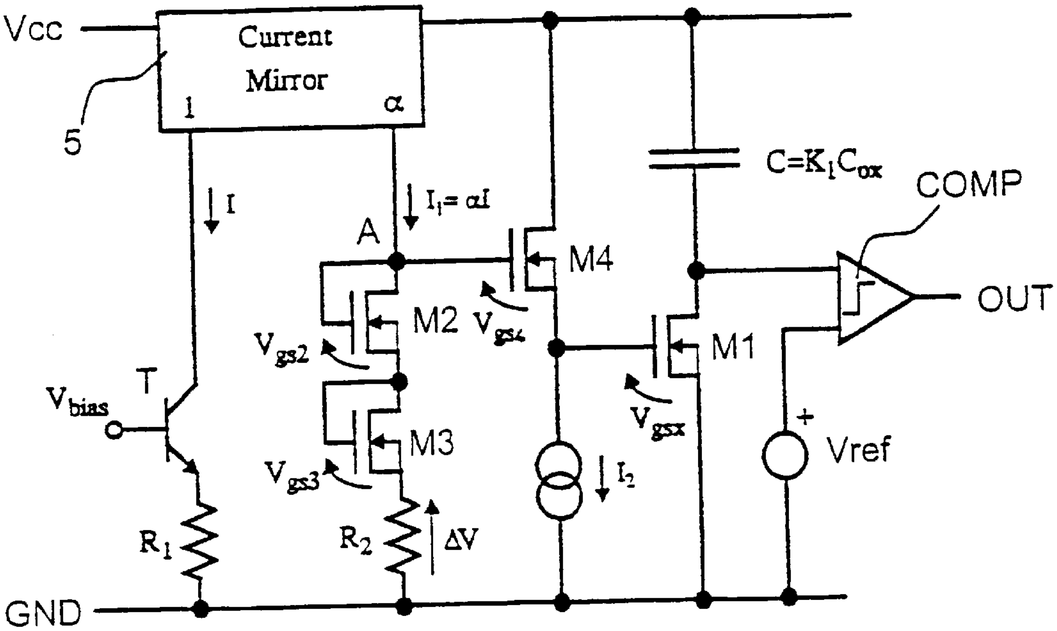
FIG. 4 is a circuit diagram of a second circuit for generation of a constant duration electrical signal independent of temperature and process variables and provided in accordance with the present invention.

An example of application in which this voltage is provided is the circuit shown in FIG. 4. This circuit uses as a current generator a current mirror 5 having a primary leg and a secondary leg.

In the primary leg a current I is forced through a bipolar transistor T biased with a current $V_{bias}$ and placed in series with a resistor R1 while in the secondary leg flows a current $I_1$ equal to a times the current I.

The voltage ΔV is provided as a voltage drop on a resistor R2 placed in series with the two transistors M2 and M3.

From the same circuit can be taken the behaviour of ΔV with temperature variation:

$$\Delta V = \alpha \cdot I \cdot R_2 = \alpha \cdot R_2 \cdot \frac{V_{bias} - V_{be0} - \frac{\Delta V_{be}}{\Delta T} \cdot (T - 25)}{R_1}$$

from which is found:

$$\Delta V = \frac{\alpha \cdot R_2}{R_1} \cdot (V_{bias} - V_{be0}) - \frac{\alpha \cdot R_2}{R_1} \cdot \frac{\Delta V_{be}}{\Delta T} \cdot (T - 25) \quad (1.10)$$

where $V_{be0}$ is the base/emitter threshold voltage of the bipolar transistor T at ambient temperature. From this and from (1.9) it is deduced that:

$$\Delta V_0 = \frac{\alpha \cdot R_2}{R_1} \cdot (V_{bias} - V_{be0})$$

and that $$\frac{\Delta V_{th}}{\Delta T} = \frac{\alpha \cdot R_2}{R_1} \cdot \frac{\Delta V_{be}}{\Delta T}$$

Setting two parameters, e.g., α and $R_1$, it is possible to find the other two, the value of the resistor R2 and the biasing voltage $V_{bias}$ of the transistor T.

Figure 5:
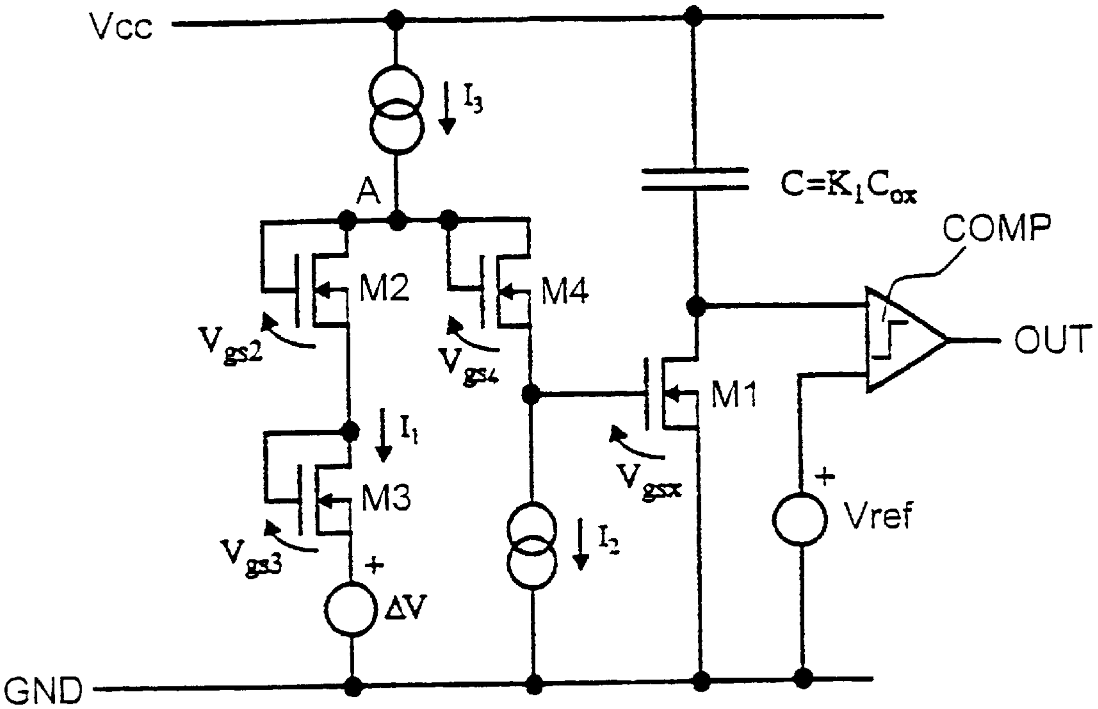
FIG. 5 is a circuit diagram of a third circuit for the generation of a constant duration electrical signal independent of temperature and process variables and provided in accordance with the present invention.

The scheme for biasing the transistors M2, M3 and M4 shown in FIGS. 3 and 4 is of course not the only one possible. The circuit shown in FIG. 5 is another example of a scheme for appropriately biasing transistors M2, M3, and M5. This circuit differs from the circuit of FIG. 3 only in the connection of the transistor M4. Indeed, the drain terminal of transistor M4 is connected to its own gate terminal in the common node A in which is applied the current of the generator I1. The important point is control of the biasing currents of the MOS transistors.

It should be understood that even though numerous features and advantages of the present invention have been set forth in the foregoing description, the above disclosure is illustrative only. Changes may be made in detail and yet remain within the broad principles of the present invention.

I claim:

1. Circuit for the generation of an electrical signal of constant duration and independent of temperature and process variables, comprising:

a capacitor;

a constant current generator for charging the capacitor;

a voltage comparator to compare the voltage present across the capacitor with a first reference voltage and supply at output a digital signal dependent upon the voltage across the capacitor; and said constant current generator comprising a first MOS transistor having a gate terminal, a source terminal and a drain terminal, biased with a fixed voltage between gate and source to conduct a certain current between the drain and source terminals, said fixed voltage being obtained as the difference between the sum of two gate-source voltages of a second and a third MOS transistors and a gate-source voltage of a fourth MOS transistor, wherein said second and third transistors are connected in diode configuration with each having its gate terminal joined to its drain terminal and are connected together in series between a first current generator and a second reference voltage.

2. Circuit in accordance with claim 1 wherein the fourth transistor has a gate terminal connected to a common node between the first current generator and the drain terminal of the second transistor with a drain terminal connected to a power supply terminal and a source terminal connected to a second current generator and to the gate terminal of the first transistor.

3. Circuit in accordance with claim 1 wherein the second reference voltage is provided by a voltage generator connected between the source terminal of the third transistor and a ground reference voltage.

4. Circuit in accordance with claim 3 wherein the voltage generator includes a resistor connected between the source terminal of the third transistor and a ground reference voltage.

5. Circuit in accordance with claim 4 wherein the first current generator is a secondary leg of a current mirror in which flows a current directly proportionate to the current running in a primary leg of the same current mirror.

6. A circuit for generating an electrical output signal of a predetermined duration substantially independent of temperature, comprising:

a capacitor;

a first current generator coupled to the capacitor, the first current generator charging the capacitor with a constant current to produce a capacitor voltage across the capacitor;

a voltage comparator having first and second input terminals and an output terminal, the first input terminal being coupled to the capacitor, the second input terminal being coupled to a first reference voltage, the voltage comparator producing at the output the electrical output signal based on a comparison of the capacitor voltage and the first reference voltage; and biasing means for causing the first current generator to generate the constant current independent of a temperature of the first current generator, wherein the biasing means includes:

a first MOS transistor;

a second MOS transistor coupled in series with the first MOS transistor; and a third MOS transistor coupled between the first MOS transistor and the constant current generator, wherein the first and second MOS transistors are each connected in a diode configuration and are connected in series between a second current generator and a second reference voltage.

7. The circuit of claim 6 wherein the first current generator includes a transistor having first and second terminals and a control terminal coupled to the biasing means, and the biasing means causes the transistor to generate the constant current between the first and second terminals independent of the temperature by biasing the transistor with a fixed voltage across the control and second terminals that is independent of the temperature.

8. The circuit of claim 6 wherein the third MOS transistor has a gate terminal connected to the second MOS transistor, a drain terminal connected to a power supply and to the capacitor, and a source terminal coupled by a second current generator to a second reference voltage.

9. A circuit for generating an electrical output signal of a predetermined duration substantially independent of temperature, comprising:

a capacitor;

a first current generator coupled to the capacitor, the first current generator charging the capacitor with a constant current to produce a capacitor voltage across the capacitor;

a voltage comparator having first and second input terminals and an output terminal, the first input terminal being coupled to the capacitor, the second input terminal being coupled to a first reference voltage, the voltage comparator producing at the output the electrical output signal based on a comparison of the capacitor voltage and the first reference voltage; and biasing means for causing the first current generator to generate the constant current independent of a temperature of the first current generator, wherein the biasing means includes:

a first MOS transistor;

a second MOS transistor coupled in series with the first MOS transistor; and a third MOS transistor coupled between the first MOS transistor and the constant current generator, wherein the first and second MOS transistors are connected in series between a second current generator and a second reference voltage, the second reference voltage being provided by a resistor connected between the second MOS transistor and a ground reference voltage.

10. A circuit for generating an electrical output signal of a predetermined duration substantially independent of temperature, comprising:

a capacitor;

a first current generator coupled to the capacitor, the first current generator charging the capacitor with a constant current to produce a capacitor voltage across the capacitor;

a voltage comparator having first and second input terminals and an output terminal, the first input terminal being coupled to the capacitor, the second input terminal being coupled to a first reference voltage, the voltage comparator producing at the output the electrical output signal based on a comparison of the capacitor voltage and the first reference voltage; and biasing means for causing the first current generator to generate the constant current independent of a temperature of the first current generator, wherein the biasing means includes:

a first MOS transistor;

a second MOS transistor coupled in series with the first MOS transistor; and a third MOS transistor coupled between the first MOS transistor and the constant current generator, wherein the first and second MOS transistors are connected in series between a second current generator and a second reference voltage, the second current generator including a current mirror having primary leg and a secondary leg, the current mirror providing in the secondary leg a current that is directly proportional to a current in the primary leg.

11. The circuit of claim 10 wherein biasing means also includes:

a bipolar transistor and a first resistor coupled in series between the primary leg and a ground reference voltage; and a second resistor coupled in series with the first and second MOS transistors between the secondary leg and the ground reference voltage.

12. A circuit for generating an electrical output signal of a predetermined duration substantially independent of temperature, comprising:

a capacitor;

a first current generator coupled to the capacitor, the first current generator charging the capacitor with a constant current to produce a capacitor voltage across the capacitor;

a voltage comparator having first and second input terminals and an output terminal, the first input terminal being coupled to the capacitor, the second input terminal being coupled to a first reference voltage, the voltage comparator producing at the output the electrical output signal based on a comparison of the capacitor voltage and the first reference voltage; and biasing means for causing the first current generator to generate the constant current independent of a temperature of the first current generator, wherein the first current generator includes a first MOS transistor having a gate-source voltage and being connected to a second reference voltage, and the biasing means includes:

a second MOS transistor having a gate-source voltage;

a third MOS transistor coupled in series with the second MOS transistor and having a gate-source voltage;

a resistance member coupled in series with the second and third MOS transistors between a common node and the second reference voltage; and a fourth MOS transistor coupled between the gate of the first MOS transistor and the second transistor and having a gate-source voltage, wherein the gate-source voltage of the first MOS transistor is equal to a difference between the gate-source voltage of the fourth MOS transistor and a sum of the gate-source voltages of the second and third MOS transistors and a voltage across the resistance member.

13. The circuit of claim 12 wherein each of the second, third, and fourth MOS transistors has a diode configuration.

14. A circuit for generating an electrical output signal of a predetermined duration substantially independent of temperature, comprising:

a capacitor having a capacitor voltage;

a voltage comparator having first and second inputs and an output, the first input being coupled to the capacitor, the second input being coupled to a first reference voltage, the voltage comparator producing at the output the output signal based on a comparison of the capacitor voltage and the first reference voltage;

a first transistor having first, second, and control terminals, the first terminal being coupled to the capacitor and the second terminal being coupled to a second reference voltage; and a biasing circuit coupled to the control terminal of the first transistor, the biasing circuit causing the first transistor to conduct a current between the first and second terminal, and the biasing circuit including:

a second transistor;

a third transistor coupled in series with the second transistor to the second reference voltage; and a fourth transistor coupled between the control terminal of the first transistor and the second transistor.

15. The circuit of claim 14 wherein the second, third, and fourth transistors are each connected in a diode configuration.

16. The circuit of claim 14 wherein the second and third transistors are connected in series between a second current generator and a resistor connected between the third transistor and the second reference voltage.

17. The circuit of claim 16 wherein the second current generator includes a current mirror having primary leg and a secondary leg, the current mirror providing in the secondary leg a current that is directly proportional to a current in the primary leg, the secondary leg being coupled to the second transistor.

* * * * *